United States Patent [19]
Dotta

[11] Patent Number: 5,783,498
[45] Date of Patent: Jul. 21, 1998

[54] METHOD OF FORMING SILICON DIOXIDE FILM CONTAINING GERMANIUM NANOCRYSTALS

[75] Inventor: Achyut Kumar Dotta, Tokyo, Japan

[73] Assignee: NEC Corporation, Japan

[21] Appl. No.: 654,121

[22] Filed: May 28, 1996

[51] Int. Cl.[6] .................. H01L 21/31; H01L 21/469
[52] U.S. Cl. .................................................. 438/778
[58] Field of Search .................................. 437/238, 240

[56] References Cited

U.S. PATENT DOCUMENTS

| | | | |
|---|---|---|---|
| 4,477,580 | 10/1984 | Fleming, Jr. | 501/12 |
| 4,845,054 | 7/1989 | Mitchener | 437/240 |
| 5,324,539 | 6/1994 | Maeda et al. | 427/255.2 |

OTHER PUBLICATIONS de Oliveira et al; "Probing of the quantum dot size distribution in CdTe–doped glasses by photoluminescence excitation spectroscopy"; Jan. 1995; pp. 439–441; Applied Physics Letters, vol. 66, No. 4.

Maeda et al; "Visible photoluminescence of Ge microcrystals embedded in $SiO_2$ glassy matrices"; Dec. 1991; pp. 3168–3170; Applied Physics Letters, vol. 59, No. 24.

Paine et al; "Visible photoluminescence from nanocrystalline Ge formed by $H_2$ reduction of $Si_{0.6}Ge_{0.4}O_2$"; May 1993; pp. 2842–2844; Applied Physics Letters, vol. 62, No. 22.

Yumoto et al; "Observation of optical bistability in $CdS_xSe_{1-x}$–doped glasses with 25–psec switching time"; Oct. 1987; pp. 832–834; Optics Letters vol. 12, No. 10.

Veprek et al; "Tungsten dye induced fast blue/violet photoluminescence from nanocrystalline silicon–silica composite thin films" 1 Oct. 1995; pp. 2215–2217; Applied Physics Letters, vol. 67, No. 15.

*Primary Examiner*—Brian Dutton
*Attorney, Agent, or Firm*—Hayes, Soloway, Hennessey, Grossman & Hage, P.C.

[57] ABSTRACT

The present invention provides a method of forming a silicon dioxide film containing germanium (Ge) nanocrystals, including the steps of (a) depositing Ge doped silicon dioxide on a substrate by means of atmospheric pressure chemical vapor deposition by which Si-based organic source, Ge-based organic source and ozone are to be reacted with one another, and (b) annealing the thus deposited Ge doped silicon dioxide film under non-reactive or reducing gas atmosphere at a temperature sufficient to break Ge-O bonds. The present invention makes it possible to grow Ge nanocrystals in a silicon dioxide film so that the Ge nanocrystals have a size sufficient to perform quantum confinement effects, and thereby provides a film suitable for fabrication of new optical devices and electronic devices utilizing non-linear optical characteristics.

24 Claims, 4 Drawing Sheets

METHOD OF FORMING SILICON DIOXIDE FILM CONTAINING GERMANIUM NANOCRYSTALS

BACKGROUND OF THE INVENTION

1. Field of the Invention

The invention relates to a method of forming a silicon (hereinafter, referred to simply as "Si") oxide film containing nanometer-sized germanium (hereinafter, referred to simply as "Ge") microcrystals or Ge nanocrystals. Such nanometer-sized Ge microcrystals are suitable for fabrication of new optical devices such as a quantum device, a photoluminescence device and an optical switch.

2. Description of the Related Art

Semiconductor nanocrystals embedded in solid matrix are suitable for constituting of a system such as quantum dots. In quantum dots, a unique optical characteristic such as optical non-linearity can be found due to zero-dimensional confinement effects of electrons and holes. Such optical non-linearity has been researched for applying to fabrication of new optical devices and electronic devices.

Such optical non-linearity caused due to quantum confinement effects can be found also in glass material into which nanocrystals are embedded. The non-linearity can be observed when nanocrystals have a size which is the same in order as that of Bohr radius of excitons. The optical non-linearity is much dependent on a size and a size distribution of nanocrystals.

An example of observation of optical bistability of silicon dioxide in which nanocrystals such as $CdS_xSe_{1-x}$ are to be embedded is reported in Junji Yumoto et al., "Observation of optical bistability in $CdS_xSe_{1-x}$ doped glasses with 25-psec switching time", Optics Letters of the Optical Society of America, Vol.12, No. 10, Oct. 1987, pp. 832–834. As an application of a silicon dioxide film into which nanocrystals such as $CdS_xSe_{1-x}$ are embedded is a commercially available filter having a steep cut-off characteristic. In $CdS_xSe_{1-x}$, an absorption edge is changed from 530 nm to 715 nm when a composition of a semiconductor layer is changed from CdS to CdSe.

As mentioned earlier, all kinds of semiconductor nanocrystals to be embedded in solid matrices such as a silicon dioxide matrix are suitable for fabrication of novel optical devices in which three-dimensional quantum confinement effects are to be used for photogenerated carriers.

The inventor proposes in the present application a method of simply forming a solid silicon dioxide film in which Ge nanocrystals are embedded. Since Ge includes electrons and holes having smaller effective mass and smaller dielectric constant than those of silicon (a difference in a dielectric constant is greater than a difference in effective mass), Ge has a smaller effective Bohr radius of excitons than that of Si.

An effective Bohr radius "a" is given by the following equation:

$$a = k\, \hbar^2/\mu e^2$$

where k is a static dielectric constant, h is a reduced Planck's constant, μ is reduced mass of an electron-hole pair, and e is electron charge. The fact that Ge has a smaller Bohr radius then Si shows that Ge exhibits a greater shift (blue shift) of optical forbidden band width than nanocrystals of Si. Accordingly, it is possible to observe remarkable optical non-linearity in a specimen of Ge nanocrystals embedded in silicon dioxide.

An example of observation of photoluminescence from Ge nanocrystals embedded in silicon dioxide is found in D. C. Paine, "Visible photoluminescence from nanocrystalline Ge formed by $H_2$ reduction of $Si_{0.6}Ge_{0.4}O_2$", Applied Physics Letters of American Institute of Physics, Vol. 62, No. 22, 31 May, 1993, pp. 2842–2844. According to this article, a silicon dioxide film containing Ge nanocrystals therein is formed by the following three steps: deposition of $Si_xGe_{1-x}$, oxidation and annealing under $H_2$ atmosphere.

FIG. 1 illustrates a sputtering apparatus used for deposition of $Si_xGe_{1-x}$. As illustrated, in a chamber 21 is disposed a substrate holder 22 containing a heater 23 therein, and a substrate 24 is placed on the substrate holder 22. In the chamber 21, a pair of targets 25 and 26 composed of Ge and Si, respectively, are also disposed facing the substrate 24. The chamber 21 is formed with a gas introduction port 21a and a gas exhaust port 21b.

Co-sputtering is carried out by means of the illustrated sputtering apparatus to thereby deposit $Si_xGe_{1-x}$, followed by high temperature annealing in an oxidizing atmosphere to thereby form an $SiO_2.GeO_2$ film. Then, the $SiO_2.GeO_2$ film is annealed in $H_2$ atmosphere to thereby diffuse hydrogen into the $SiO_2.GeO_2$ film. As a result, $GeO_2$ is reduced, and hence Ge nanocrystals are grown.

The above mentioned method of growing nanocrystals is the same as a method used for growth of $CdS_xSe_{1-x}$ nanocrystals.

Another example of observation of photoluminescence of Ge nanocrystals embedded in silicon dioxide is found in Yoshihito Maeda et al., "Visible photoluminescence of Ge microcrystals embedded in $SiO_2$ glassy matrices", Applied Physics Letters of American Institute of Physics, Vol. 59, No. 24, 9 Dec., 1991, pp. 3168–3170. In this article, Ge microcrystals embedded in $SiO_2$ glassy matrices are formed by a radio-frequency magnetron cosputtering technique, and then annealed at 800° C. for 30 minutes. The annealed sample showed a strong room temperature luminescence.

An analysis on quantum dot size distribution is found in C. R. M. de Oliveira et al., "Probing of the quantum dot size distribution in CdTe-doped glasses by photoluminescence excitation spectroscopy", Applied Physics Letters of American Institute of Physics, Vol. 66, No. 4, 23 Jan., 1995, pp. 439–441. This article reports confinement effects in CdTe quantum dots detected by means of photoluminescence excitation spectroscopy.

An experiment on photoluminescence caused from nanocrystalline composite film is reported in S. Veprek et al., "Tungsten "dye" induced fast blue/violet photoluminescence from nanocrystalline silicon-silica composite thin films", Applied Physics Letters of American Institute of Physics, Vol. 67, No. 15, 9 Oct., 1995, pp. 2215–2217. According to this article, doping of the nanocrystalline-Si/ $SiO_2$ composite material with tungsten results in a quenching of the red photoluminescence and an appearance of an intense blue/violet one.

As mentioned earlier, a cosputtering process has been conventionally used for the formation of a silicon dioxide film containing nanocrystals of Ge or $CdS_xSe_{1-x}$. Thus, a content, that is, the concentration, of nanocrystals in silicon dioxide is dependent on a sputtering target, and hence, there arises a problem that it is not possible to vary the content of nanocrystals in the case that a fixed target is used.

In conventional methods, after $H_2$ has diffused into a silicon dioxide film during annealing, hydrogen reacts with $GeO_2$. Thus, the conventional methods need a long period of time for growing Ge nanocrystals, and hence, it is quite difficult to control Ge nanocrystal size distribution in a silicon dioxide film. Inappropriate size distribution of Ge nanocrystals in a silicon dioxide film caused by long time high temperature annealing deteriorates optical characteristics expected to obtain. Accordingly, it is sometimes impossible to observe quantum size effects.

For novel optical devices which will be required to perform quantum confinement effects, it is quite important to form nanocrystals in desired size and content, and to appropriately control the size distribution of nanocrystals in order to grow Ge nanocrystals.

SUMMARY OF THE INVENTION

It is an object of the present invention to provide a method of forming a silicon dioxide film containing Ge nanocrystals, which is simpler than the conventional methods and is capable of obtaining a silicon dioxide film to contain Ge nanocrystals in desired size, content and size distribution.

The present invention provides a method of forming a silicon dioxide film containing Ge nanocrystals, including the steps of (a) depositing a Ge doped silicon dioxide film on a substrate by means of atmospheric pressure chemical vapor deposition (APCVD) by which Si-based organic source, Ge-based organic source and ozone are to be reacted with one another, and (b) annealing the thus deposited Ge doped silicon dioxide film under non-reactive or reducing gas atmosphere at a temperature sufficient to break Ge-O bondings.

For instance, the Si-based organic source is selected from tetraetoxysilicate (TEOS) or tetrametoxysilicate, and the Ge-based organic source is selected from trimethylgerminate (TMG) or ethylgerminate.

Boron (B), phosphorus (P), titanium (Ti), aluminum (Al) or combination thereof may be doped into the silicon dioxide film in the step (a) so that the silicon dioxide film contains them as a dopant. As an alternative, B, P, Ti, Al, $CdS_xSe_{1-x}$ or combination thereof may be doped into the silicon dioxide film so that the silicon dioxide film includes nanocrystals of at least one of B, P, Ti, Al, $CdS_xSe_{1-x}$ and combination thereof.

It is preferable that the atmospheric pressure chemical vapor deposition in the step (a) is carried out in the range of 300° C. to 450° C. both inclusive, and that the annealing in the step (b) is carried out in the range of 600° C. to 900° C. both inclusive.

For instance, as non-reactive gas is used argon (Ar) or nitrogen ($N_2$) gas, and as reducing gas is used hydrogen ($H_2$) gas in the step (b).

The conventional methods need three steps, namely, deposition of $Si_xGe_{1-x}$, oxidation and annealing under $H_2$ atmosphere, for growing Ge nanocrystals in silicon dioxide matrix, whereas the present invention needs only two steps. Thus, the present invention simplifies a method of growing Ge nanocrystals.

In addition, since the present invention employs APCVD for the formation of a Ge doped silicon dioxide film, it is possible to control the content of Ge with high accuracy by carrying out flow rate control of source gases.

Furthermore, the growth of Ge nanocrystals are performed by breaking Ge-O bondings in the present invention, which makes it possible to complete crystal growth in a relatively short period of annealing time. As a result, it is possible to control a size of nanocrystals with accuracy.

Thus, in accordance with the present invention, there can be provided a Ge nanocrystals containing silicon dioxide film by a simpler method than conventional methods, which is suitable for novel optical devices which will be required to perform quantum confinement effects to photogenerated carriers.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENT

Figure 1:
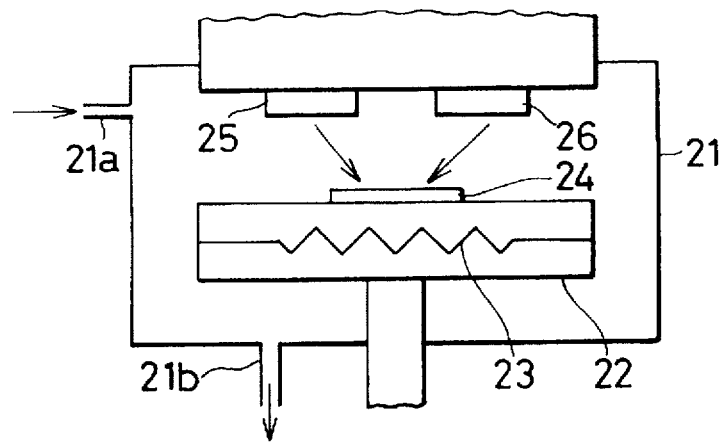
FIG. 1 is a schematic view illustrating a cross-section of a sputtering apparatus for carrying out a conventional method.
Figure 2:
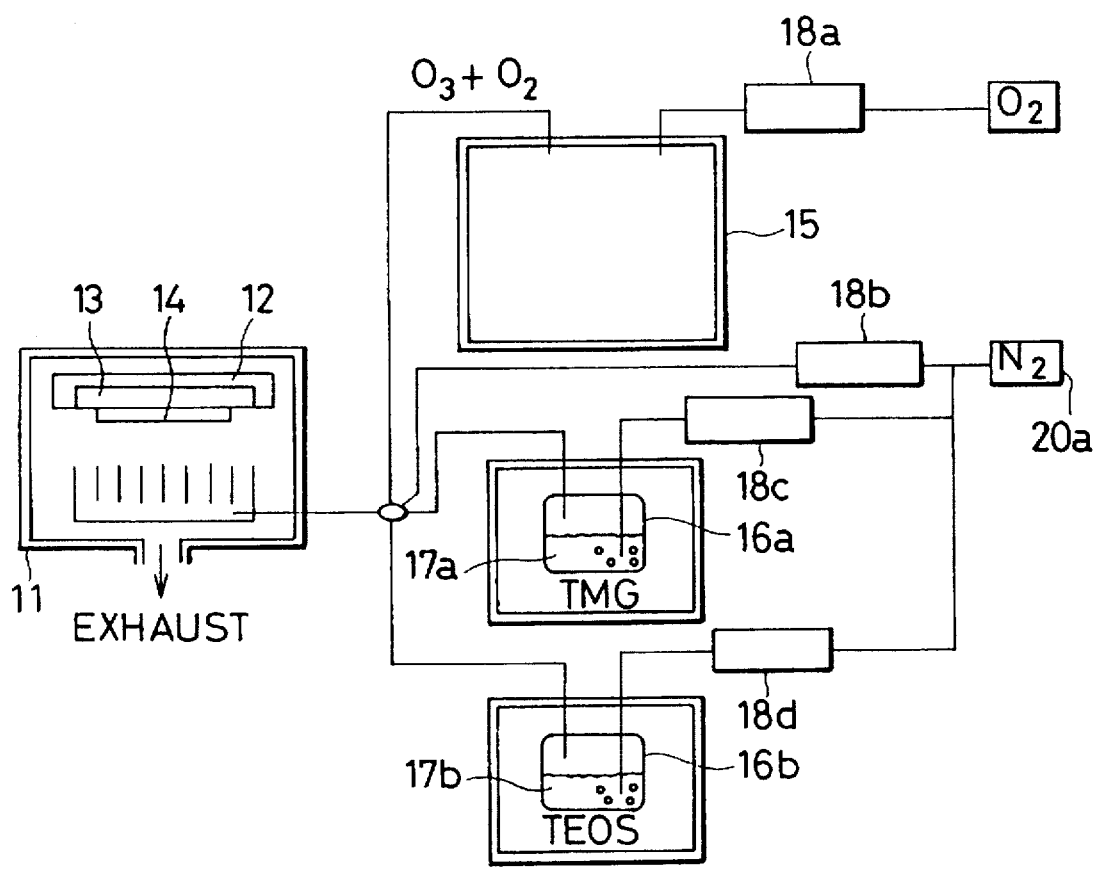
FIG. 2 is a schematic view illustrating a film deposition apparatus to be used in the embodiment of the present invention.

Hereinbelow will be explained an embodiment of the present invention by which Ge nanocrystals are grown in a silicon dioxide film. With reference to FIG. 2, a germo-silicate-glass film is first deposited on a substrate, as mentioned below, by means of an atmospheric pressure chemical vapor deposition (APCVD) apparatus.

As illustrated in FIG. 2, in a reactive chamber 11 is disposed a substrate holder 12 containing a heater 13 therein. A substrate 14 is placed on the substrate holder 12.

An ozonizer 15, a bubbler 16a and a bubbler 16b introduce ozone, Ge source gas and Si source gas into the reactive chamber 11, respectively, together with nitrogen ($N_2$) gas supplied from an $N_2$ gas source 20a. The bubbler 16a contains trimethylgerminate (TMG: $Ge(OCH_3)_4$) as a Ge source 17a, and the bubbler 16b contains tetraetoxysilicate (TEOS: $Si(OC_2H_5)_4$) as a Si source 17b. These sources 17a and 17b are pressurized and thus are in liquid form. The sources 17a and 17b are vaporized in the bubblers 16a and 16b, and then introduced into the reactive chamber 11 together with the $N_2$ gas supplied from the $N_2$ gas source 20a and acting as a carrier gas. A temperature in the bubblers 16a and 16b to be applied to each of the sources 17a and 17b for vaporizing them is equal to or greater than 40° C. and 60° C., respectively. Flow rates of the ozone gas, the $N_2$ gas, the TMG gas and the TEOS gas are controlled by means of flow controllers 18a to 18d, respectively.

Figure 3:
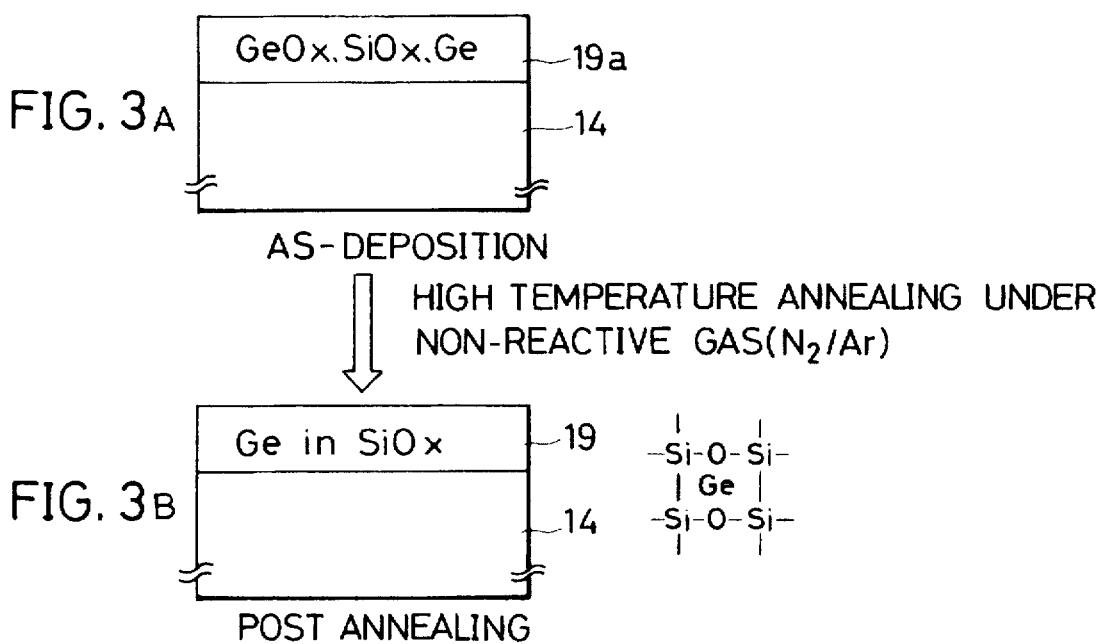
FIG. 3 includes cross-sectional views of a substrate in as-deposition (A) and post annealing (B)

The TMG and TEOS gases introduced into the reactive chamber 11 together with the non-reactive $N_2$ gases are sprayed onto the substrate 14, and react with ozone ($O_3$). Thus, there are produced germanium oxide and silicon oxide, which deposit on the substrate 14. Namely, as illustrated in FIG. 3-(A), here is deposited a germo-silicate-glass film 19a on the substrate 14. During deposition, the substrate 14 is kept at 300° C. or greater.

In the deposited silicon oxide film, Ge is present in the form of germanium oxide ($GeO_x$). This was confirmed by means of an X-ray photoelectron spectrometer (XPS). The Ge content in the silicon oxide film can be controlled by controlling flow rates of source gases prior to mixing of TMG with TEOS by using APCVD. For instance, assuming that a flow rate of TEOS is 3.0 standard liter per minute and a flow rate of TMG is 1.8 standard liter per minute, it is possible to introduce Ge into silicon oxide at 7.5 weight percent or greater.

Then, annealing is carried out in a non-reactive gas atmosphere to thereby cause germanium oxide present in the germo-silicate-glass film 19a to convert into Ge nanocrystals. As a result, as illustrated in FIG. 3-(B), the germosilicate-glass film 19a is converted into a silicon dioxide film 19 containing Ge nanocrystals therein. The non-reactive gas to be used during the annealing may be selected from Ar or $N_2$. There may be used a reducing gas such as $H_2$ during the annealing, in which case the reducing gas reacts with germanium oxide, and as a result, there are produced germanium and water. The thus produced water diffuses out from a bulk, and leaves Ge nanocrystals in the silicon dioxide film 19. Atomic hydrogen may also be used instead of non-excited $H_2$ gas.

A size of Ge nanocrystals formed in the silicon dioxide film 19 is dependent on temperature range and a duration of annealing. It was found that if the annealing temperature was increased from 750° C. to 850° C. and further if the annealing time is extended from an hour to two hours, a size of Ge nanometers was increased from 5 nm to 8 nm.

Figure 4:
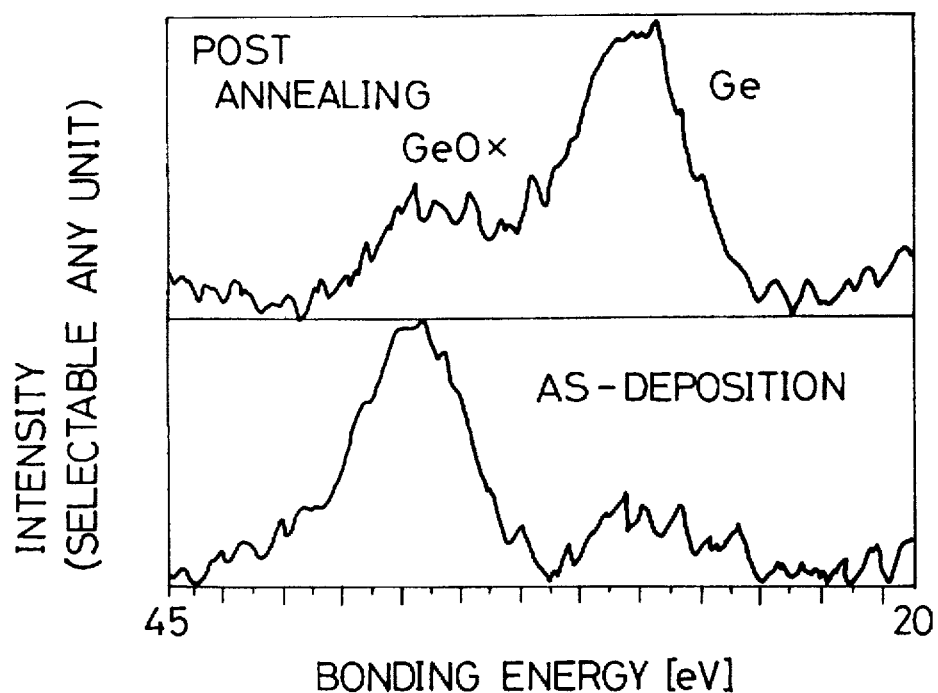
FIG. 4 includes X-ray photoelectron spectroscopic curves of a sample in post annealing and as-deposition.
Figure 5:
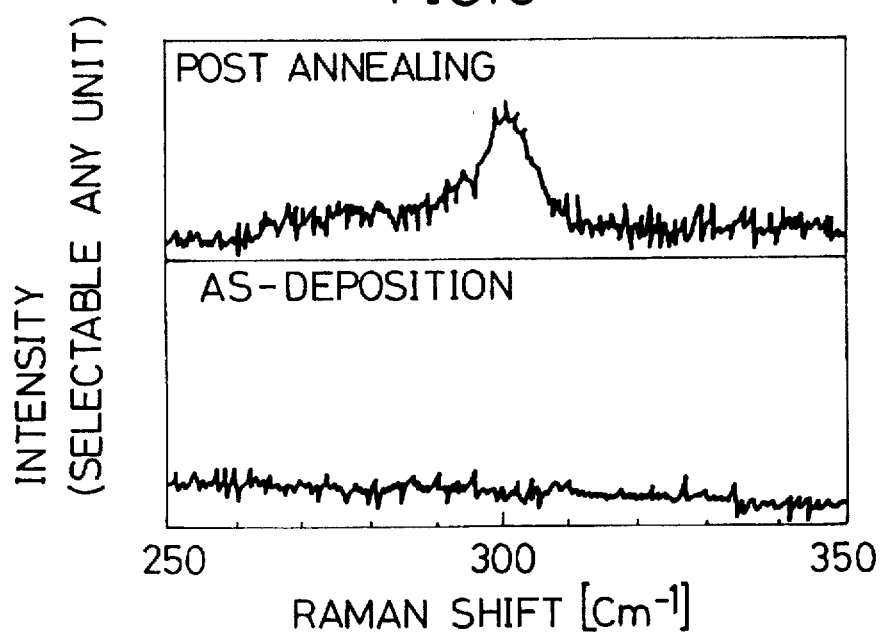
FIG. 5 includes Raman spectroscopic spectra of a sample in post annealing and as-deposition.

FIGS. 4 and 5 show X-ray photoelectron spectroscopic curves and Raman spectra having been measured for both an as-deposited sample and a post annealing sample, respectively. It is understood in view of these spectra that annealed samples have a greater peak for Ge than a peak for $GeO_x$, which shows that germanium oxide is converted into germanium subsequent to decomposition of oxide structure. Oxygen having been separated from germanium makes a bond with $SiO_x$ or Si to thereby increase silicon dioxide content.

That is, it is thought that the following reactions take place during the annealing.

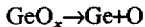
$GeO_x \rightarrow Ge+O$
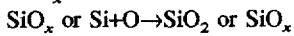
$SiO_x$ or $Si+O \rightarrow SiO_2$ or $SiO_x$ It is understood in view of Raman spectroscopic spectrum illustrated in FIG. 5 that Ge nanocrystals formed in silicon dioxide have a size ranging from about 4 to about 6 nm both inclusive. It is also understood that as an annealing time becomes longer, Ge nanocrystals have a greater size.

Figure 6:
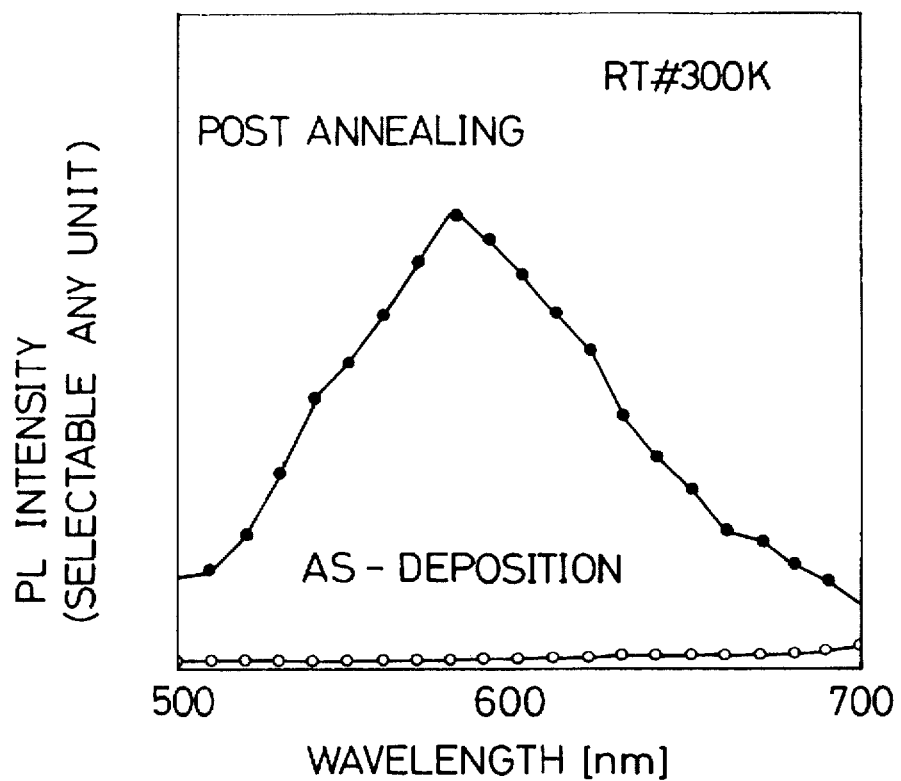
FIG. 6 is a graph of photoluminescence intensity distribution of a sample in post annealing and as-deposition.

Photoluminescence was measured for annealed silicon oxide samples in which Ge nanocrystals are supposed to be embedded. The results are shown in FIG. 6. It is understood in view of a curve illustrated in FIG. 6 that there is a sharp peak of photoluminescence at a visible wavelength of about 580 nm. It is also understood that a peak of photoluminescence becomes smaller for a sample having been annealed in a longer period of time. This is because a sample having been annealed for longer period of time contains Ge nanocrystals having a greater size, and as a result, the quantum confinement effects on photogenerated carriers are decreased in such a sample.

In the embodiment, it is preferable that the substrate is kept at a temperature in the range of 300° C. to 450° C. both inclusive during silicon dioxide deposition, and it is also preferable that the subsequent annealing is to be carried out at a temperature in the range of 600° C. to 900° C. both inclusive.

In the embodiment, tetraetoxysilicate (TEOS) and trimethylgerminate (TMG) are used as Si and Ge sources, respectively. However, it should be noted that there may be used other organic sources such as tetrametoxysilicate and ethylgerminate as Si and Ge sources, respectively.

In addition, it is possible to grow nanocrystals other than Ge such as boron (B), phosphorus (P), titanium (Ti), aluminum (Al) and combination thereof in silicon dioxide by means of APCVD. Organic-based fluids may be used as sources of those. Furthermore, B, P, Ti, Al or combination thereof may be doped into silicon dioxide as an impurity dopant. In particular, when silicon dioxide containing no impurities is to be used as solid matrix, it is quite difficult to form a thick film, however, it becomes easier to form a thick film by doping impurities such as B and p into silicon dioxide.

Nanocrystals of $CdS_xSe_{1-x}$ may be introduced together with Ge into silicon dioxide matrix.

As described, the present invention employs APCVD for depositing Ge doped silicon dioxide and carries out annealing for the Ge doped silicon dioxide. Thus, it is possible to grow Ge nanocrystals having appropriate size distribution and content in silicon dioxide matrix. Thus, the present invention makes it possible to grow Ge nanocrystals in a silicon dioxide film so that the Ge nanocrystals have a size sufficient to perform quantum confinement effects, and thereby makes it possible also to provide a film suitable for fabrication of new optical devices and electronic devices utilizing optical non-linear characteristics.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of forming a silicon dioxide film containing germanium (Ge) nanocrystals, comprising the steps of:
   (a) depositing a Ge doped silicon dioxide film on a substrate by means of atmospheric pressure chemical vapor deposition by which a Si-based organic source, a Ge-based organic source and ozone are to be reacted with one another; and
   (b) annealing the thus deposited Ge doped silicon dioxide film in a nonreactive or reducing gas atmosphere at a temperature sufficient to break Ge-O bondings.

2. The method as set forth in claim 1, wherein said Si-based organic source is tetraetoxysilicate (TEOS).

3. The method as set forth in claim 1, wherein said Ge-based organic source is trimethylgerminate (TMG).

4. The method as set forth in claim 1, wherein said Si-based organic source is tetrametoxysilicate.

5. The method as set forth in claim 1, wherein said Ge-based organic source is ethylgerminate.

6. The method as set forth in claim 1, wherein said annealing in said step (b) is carried out for up to about two hours.

7. The method as set forth in claim 1, wherein said step (a) includes a step of doping B, P, Ti, Al, $CdS_xSe_{1-x}$ or combination thereof into said Ge doped silicon dioxide film so that said Ge doped silicon dioxide film includes nanocrystals of at least one of B, P, Ti, Al, $CdS_xSe_{1-x}$ and combination thereof.

8. The method as set forth in claim 7, wherein said Si-based organic source is tetraetoxysilicate (TEOS).

9. The method as set forth in claim 7, wherein said Ge-based organic source is trimethylgerminate (TMG).

10. The method as set forth in claim 1, wherein said atmospheric pressure chemical vapor deposition in said step (a) is to be carried out in the range of 300° C. to 450° C. both inclusive.

11. The method as set forth in claim 10, wherein said Si-based organic source is tetraetoxysilicate (TEOS).

12. The method as set forth in claim 10, wherein said Ge-based organic source is trimethylgerminate (TMG).

13. The method as set forth in claim 1, wherein said annealing in said step (b) is to be carried out in the range of 600° C. to 900° C. both inclusive.

14. The method as set forth in claim 1, wherein argon (Ar) or nitrogen ($N_2$) gas is to be used as non-reactive gas in said step (b).

15. The method as set forth in claim 1, wherein hydrogen ($H_2$) gas is to be used as said reducing gas in said step (b).

16. The method as set forth in claim 13, wherein said annealing in said step (b) is carried out for up to about two hours.

17. The method as set forth in claim 13, wherein said annealing in said step (a) is carried out at a temperature above 800° C.

18. The method as set forth in claim 17, wherein said annealing in said step (b) is carried out for up to two hours.

19. A method of forming a silicon dioxide film containing germanium (Ge) nanocrystals, comprising the steps of:

(a) depositing a Ge doped silicon dioxide film on a substrate by means of atmospheric pressure chemical vapor deposition at a temperature in the range of 300° C. to 450° C. both inclusive, by which a Si-based organic source, a Ge based organic source and ozone are reacted with one another; and (b) annealing the deposited Ge doped silicon dioxide film in a non-reactive or reducing gas atmosphere at a temperature sufficient to break Ge-O bondings.

20. A method of forming a silicon dioxide film containing B, P, Ti, or Al nanocrystals, or combination thereof, comprising the steps of:

(a) depositing a B, P, Ti or Al doped silicon dioxide film on a substrate by means of atmospheric pressure chemical vapor deposition by which a Si-based organic source, a B, P, Tli or Al based organic source and ozone are to be reacted with one another; and (b) annealing the thus deposited B, P, Ti or Al doped silicon dioxide film in a non-reactive or reducing gas atmosphere at a temperature sufficient to break B-O, P-O, Ti-O, or Al-O bondings.

21. The method as set forth in claim 20, wherein said Si-based organic source is tetraetoxysilicate (TEOS).

22. The method as set forth in claim 20, wherein said Si-based organic source is tetramethoxysilicate.

23. A method of forming a silicon dioxide film containing germanium (Ge) nanocrystals, comprising the steps of:

(a) depositing a Ge doped silicon dioxide film on a substrate by means of atmospheric pressure chemical vapor deposition by which a Si-based organic source, a Ge based organic source comprising ethyl germinate and ozone are reacted with one another; and (b) annealing the deposited Ge doped silicon dioxide film in a non-reactive or reducing gas atmosphere at a temperature sufficient to break Ge-O bondings.

24. A method of forming a silicon dioxide film containing germanium (Ge) nanocrystals, comprising the steps of:

(a) depositing a Ge doped silicon dioxide film on a substrate by means of atmospheric pressure chemical vapor deposition by which a Si-based organic source, a Ge based organic source comprising trimethylgerminate (TMG) and ozone are reacted with one another, including the step of doping B, P, Ti, Al, $CdS_xSe_{1-x}$ or combination thereof in said Ge doped silicon dioxide film so that said Ge doped silicon dioxide film further includes nanocrystals of at least one of B, P, Ti, Al, $CdS_xSe_{1-x}$ and combinations thereof; and (b) annealing the deposited Ge doped silicon dioxide film in a non-reactive or reducing gas atmosphere at a temperature sufficient to break Ge-O bondings.

* * * * *

UNITED STATES PATENT AND TRADEMARK OFFICE
CERTIFICATE OF CORRECTION

PATENT NO. : 5,783,498
DATED : July 21, 1998
INVENTOR(S) : Dotta

It is certified that error appears in the above-identified patent and that said Letters Patent is hereby corrected as shown below:

Claim 20, Col. 8, line 2, "Tli" should be - -Ti- -.

Signed and Sealed this

Sixteenth Day of November, 1999

Attest:

Q. TODD DICKINSON

*Attesting Officer*  *Acting Commissioner of Patents and Trademarks*